(12) United States Patent
Yu

(10) Patent No.: US 6,391,695 B1
(45) Date of Patent: May 21, 2002

(54) DOUBLE-GATE TRANSISTOR FORMED IN A THERMAL PROCESS

(75) Inventor: Bin Yu, Sunnyvale, CA (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 0 days.

(21) Appl. No.: 09/633,312

(22) Filed: Aug. 7, 2000

(51) Int. Cl.$^7$ .................. H01L 21/00; H01L 21/84; H01L 21/04

(52) U.S. Cl. .................. 438/166; 438/157; 438/160; 438/162; 438/511

(58) Field of Search .................. 438/166, 157, 438/160, 162, 511, 522, 530

(56) References Cited

U.S. PATENT DOCUMENTS

| | | | |
|---|---|---|---|
| 5,426,069 A | * 6/1995 | Selvakumar et al. | ........ 437/131 |
| 5,591,653 A | 1/1997 | Sameshima et al. | |
| 5,910,015 A | 6/1999 | Sameshima et al. | |
| 5,918,116 A | * 6/1999 | Chittipeddi | .................. 438/199 |
| 5,956,603 A | * 9/1999 | Talwa et al. | ................. 438/520 |
| 5,981,345 A | 11/1999 | Ryum et al. | |
| 6,074,920 A | * 6/2000 | Houston | ..................... 438/289 |
| 6,096,627 A | * 8/2000 | Harris et al. | ................. 438/520 |
| 6,228,694 B1 | * 5/2001 | Doyle et al. | ................. 438/199 |

* cited by examiner

Primary Examiner—John F. Niebling
Assistant Examiner—Viktor Simkovic
(74) Attorney, Agent, or Firm—Foley & Lardner

(57) ABSTRACT

A method for forming a double-gate SOI MOS transistor with a back gate formed by a laser thermal process is described. In this method, a back gate is formed in a semiconductor substrate and is subsequently amorphized by implanting an amorphization species such as germanium, silicon, and xenon. The amorphous back gate region is melted using a laser annealing process and subsequently recrystallized to form the back gate.

20 Claims, 5 Drawing Sheets

DOUBLE-GATE TRANSISTOR FORMED IN A THERMAL PROCESS

CROSS REFERENCE TO RELATED APPLICATIONS

The present application is related to U.S. application Ser. No. 09/633,209 filed by Yu on an even date herewith entitled "Double Gate Transistor Having A Silicon/Germanium Channel Region" assigned to the assignee of the present Application and herein incorporated by reference.

FIELD OF THE INVENTION

The present invention relates to integrated circuits and methods of manufacturing integrated circuits. More particularly, the present invention relates to a method of manufacturing integrated circuits having a double-gate SOI MOS transistor.

BACKGROUND OF THE INVENTION

Currently, deep-submicron complementary metal oxide semiconductor (CMOS) is the primary technology for ultra-large-scale integrated (ULSI) circuits. Over the last two decades, reduction in the size of CMOS transistors has been a principal focus of the microelectronics industry.

Transistors, such as metal oxide semiconductor field effect transistors (MOSFETs), are generally either bulk semiconductor-type devices or silicon-on-insulator (SOI)-type devices. Most integrated circuits (ICs) are fabricated in a CMOS process on a bulk semiconductor substrate.

In bulk semiconductor-type devices, transistors, such as MOSFETs, are built on the top surface of a bulk substrate. The substrate is doped to form source and drain regions, and a conductive layer is provided between the source and drain regions. The conductive layer operates as a gate for the transistor; the gate controls current in a channel between the source and the drain regions. As transistors become smaller, the body thickness of the transistor (or thickness of the depletion layer below the inversion channel) must be scaled down to achieve superior short-channel performance.

Conventional SOI-type devices include an insulative substrate attached to a thin-film semiconductor substrate that contains transistors similar to the MOSFETs described with respect to bulk semiconductor-type devices. The insulative substrate generally includes a buried insulative layer above a lower semiconductor base layer. The transistors on the insulative substrate have superior performance characteristics due to the thin-film nature of the semiconductor substrate and the insulative properties of the buried insulative layer. In a fully depleted (FD) MOSFET, the body thickness is so small that the depletion region has a limited vertical extension, thereby eliminating link effect and lowering hot carrier degradation. The superior performance of SOI devices is manifested in superior short-channel performance (i.e., resistance to process variation in small size transistors), near-ideal subthreshold voltage swing (i.e., good for low off-state current leakage), and high saturation current.

Ultra-large-scale integrated (ULSI) circuits generally include a multitude of transistors, such as, more than one million transistors and even several million transistors that cooperate to perform various functions for an electronic component. The transistors are generally complementary metal oxide semiconductor field effect transistors (CMOSFETs) which include a gate conductor disposed between a source region and a drain region. The gate conductor is provided over a thin gate oxide material. Generally, the gate conductor can be a metal, a polysilicon, or a polysilicon/germanium (SiXGe(l-x)) material that controls charge carriers in a channel region between the drain and the source to turn the transistor on and off. The transistors can be N-channel MOSFETs or P-channel MOSFETs.

Generally, it is desirable to manufacture smaller transistors to increase the component density on an integrated circuit. It is also desirable to reduce the size of integrated circuit structures, such as vias, conductive lines, capacitors, resistors, isolation structures, contacts, interconnects, etc. For example, manufacturing a transistor having a reduced gate length (a reduced width of the gate conductor) can have significant benefits. Gate conductors with reduced widths can be formed more closely together, thereby increasing the transistor density on the IC. Further, gate conductors with reduced widths allow smaller transistors to be designed, thereby increasing speed and reducing power requirements for the transistors.

Heretofore, lithographic tools have been utilized to form transistors and other structures on the integrated circuit. For example, lithographic tools can be utilized to define gate conductors, active lines, conductive lines, vias, doped regions, and other structures associated with an integrated circuit. Most conventional lithographic fabrication processes have only been able to define structures or regions having a dimension of 100 nm or greater.

In one type of conventional lithographic fabrication process, a photoresist mask is coated over a substrate or a layer above the substrate. The photoresist mask is lithographically patterned by providing electromagnetic radiation, such as, ultraviolet light, through an overlay mask. The portions of the photoresist mask exposed to the electromagnetic radiation react (e.g. are cured). The uncured portions of the photoresist mask are removed, thereby creating a photoresist mask having a pattern transposed from the pattern associated with the overlay. The patterned photoresist mask is utilized to etch other mask layers or structures. The etched mask layer and structures, in turn, can be used to define doping regions, vias, lines, etc.

As the dimensions of structures or features on the integrated circuit reach levels below 100 nm or even 50 nm, lithographic techniques are unable to precisely and accurately define the feature. For example, as described above, reduction of the width of the gate conductor (the gate length) associated with a transistor or the active line associated with an SOI transistor has significant beneficial effects. Future designs of transistors may require that the active line have a width of less than 50 nanometers.

Double-gate SOI MOSFET technology has received significant attention because of its advantages related to high drive current and high immunity to short channel effects. A double-gate MOSFET structure (FinFet) is discussed in "Sub 50-nm FinFet: PMOS," by Huang et al., International Electron Devices Meeting 1999. In addition, U.S. Pat. No. 5,889,302, issued to the assignee of the present application on Mar. 30, 1999, discusses a quadruple-gate field effect transistor on an SOI substrate. The double-gate MOSFET and quadruple-gate MOSFET are able to increase the drive current because the gate surrounds the active region by more than one layer (e.g., the effective gate total width is increased due to the double or quadruple gate structure). However, patterning narrow, dense active regions is challenging. As discussed above with respect to gate conductors, conventional lithographic tools are unable to accurately and precisely define active regions as structures or features with dimensions below 100 nm or 50 nm.

Thus, there is a need for a process to form multiple active lines on an SOI substrate with critical dimensions not definable by lithography techniques. Further, there is a need for an integrated circuit or electronic device that includes smaller, more densely disposed active regions or active lines. Further still, there is a need for a ULSI circuit which does not utilize conventional lithographic techniques to define active regions or active lines. Even further still, there is a need for a non-lithographic approach for defining active regions or active lines having at least one topographic dimension less than 100 nanometers and less than 50 nanometers (e.g., 20–50 nm). Yet further still, there is a need for an SOI integrated circuit with transistors having multiple-sided gate conductors associated with active lines having a width of approximately 20 to 50 nm.

SUMMARY OF THE INVENTION

An exemplary embodiment relates to a method of manufacturing a back gate for a semiconductor transistor. The method includes implanting an amorphization implant into a semiconductor substrate to create an amorphous back gate region in the substrate, melting the amorphous back gate region, and recrystallizing the amorphous back gate region to form an active back gate region.

Another exemplary embodiment relates to a back gate for a semiconductor transistor formed by laser thermal process. The process includes providing an implam into a substrate to create an amorphous region in a substrate, melting the amorphous region, and converting the amorphous region into an active region having a single crystal structure.

Another exemplary embodiment relates to a method of manufacturing a semiconductor transistor structure. The method includes growing a thermal oxide layer on a semiconductor substrate, removing a portion of the thermal oxide layer to create a seeding window therein, implanting an amorphization implant into the substrate to create an amorphous back gate region in the substrate, implanting a dopant in the amorphous back gate region, and depositing an amorphous silicon layer over the thermal oxide. The method further includes melting the amorphous silicon layer and the amorphous back gate region, recrystallizing the melted silicon layer to form an active silicon layer, and recrystallizing the amorphous back gate region to form an active back gate region.

Other features and advantages of embodiments of the invention will become apparent to those skilled in the art upon review of the following drawings, the detailed description, and the appended claims.

BRIEF DESCRIPTION OF THE DRAWINGS

Exemplary embodiments will hereafter be described with reference to the accompanying drawings, wherein like numerals denote like elements, and.

DETAILED DESCRIPTION OF THE EXEMPLARY EMBODIMENTS

Figure 1:
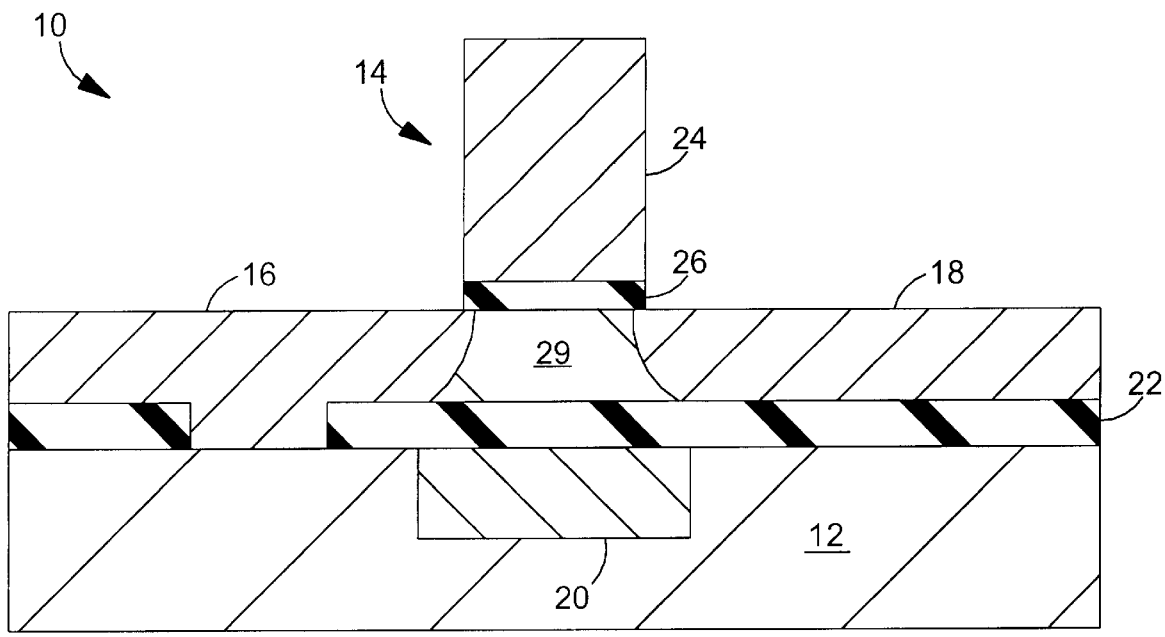
FIG. 1 is a cross-sectional view of a portion of an integrated circuit in accordance with an exemplary embodiment of the present invention, the integrated circuit including a transistor having a double gate structure.

Referring to FIG. 1, a portion 10 of an integrated circuit (IC) or chip includes a substrate 12, a gate structure 14, a source region 16, a drain region 18, a back gate region 20, and an oxide layer 22. Portion 10 is preferably part of an ultra-large-scale integrated (ULSI) circuit having at least one million transistors. Portion 10 is manufactured as part of the IC on a semiconductor wafer, such as, a silicon wafer.

Substrate 12 is any of a variety of semiconductor materials, such as, silicon, germanium, and gallium arsenide. Substrate 12 is preferably a P-type silicon substrate. Most preferably substrate 12 is a thin-film semiconductor (silicon) layer which is part of a silicon-on-insulator substrate.

In exemplary embodiment, gate structure includes a polysilicon gate electrode or conductor 24, disposed over a gate dielectric or insulator 26, such as, thermally grown silicon dioxide. Gate structure 14 is aligned between source region 16 and drain region 18, which are active regions in substrate 12. Gate structure 14 is 1000–2000 Å thick (height) and can include insulative sidewall spacers. Active regions are areas in portion 10 including impurities or dopants such as P-type dopant (e.g., boron) or N-type dopant (e.g., phosphorus). In an exemplary embodiment, source region 16 and drain region 18 are formed by ion implantation or doping. In one embodiment, source region 16 and drain region 18 are 60–100 nm deep.

Back gate region 20 is an active region in substrate 12 that is aligned between source region 16 and drain region 18 and beneath the area where gate structure 14 is formed. Back gate region 20 is an amorphous region in substrate 12 which is recrystallized subsequent to amorphization and melting. To amorphize region 20 prior to melting and recrystallization, at least one amorphization species, such as, germanium, silicon, or xenon, is implanted in substrate 12. Back gate region 20 is further implanted with an N+ dopant, such as arsenic or phosphorous. Alternatively, a P + type dopant may be implanted in back gate region 20. In one embodiment, back gate region 20 extends 50–200 nm deep into substrate 12. Oxide layer 22 is a layer disposed over substrate 12 which is 12–20 Å thick thermally-grown silicon dioxide. A channel region 29 is disposed between gate structure 24 and back gate region 20. Region 29 is preferably 50–500 Å thick and 25–1000 Å wide single crystalline silicon. Region 29 is preferably lightly doped with P-type dopants for an N-channel transistor.

An exemplary method of forming portion 10 is described below with reference to FIGS. 1–10. The method advantageously forms portion 10 including a heavy germanium implant dosage in the active regions, such as, back gate region 38. Alternatively, other amorphization implant materials, such as silicon and xenon, may be used. The heavy implant dosage converts a region of the crystalline substrate 12 into an amorphous region. The melting temperature of an amorphous silicon-germanium region is much lower than that of a single crystal silicon substrate. As such, the laser energy needed for melting the implanted region can be reduced.

Figure 2:
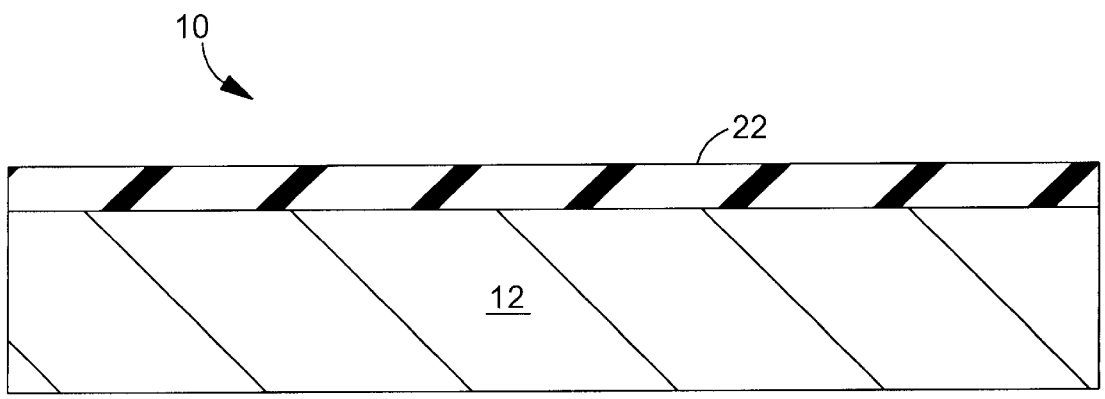
FIG. 2 is a cross-sectional view of the portion of the integrated circuit illustrated in FIG. 1, showing a thin oxide layer growth step.

In FIG. 2, a cross-sectional view of portion 10 illustrates a thin oxide layer growth step in which oxide layer 22 is thermally grown on substrate 12. In an exemplary embodiment, oxide layer 22 is silicon dioxide ($SiO_2$) and has a thickness of 12–20 Å. Substrate 12, over which oxide layer 22 is disposed, is preferably a lightly doped P-type silicon substrate.

Figure 3:
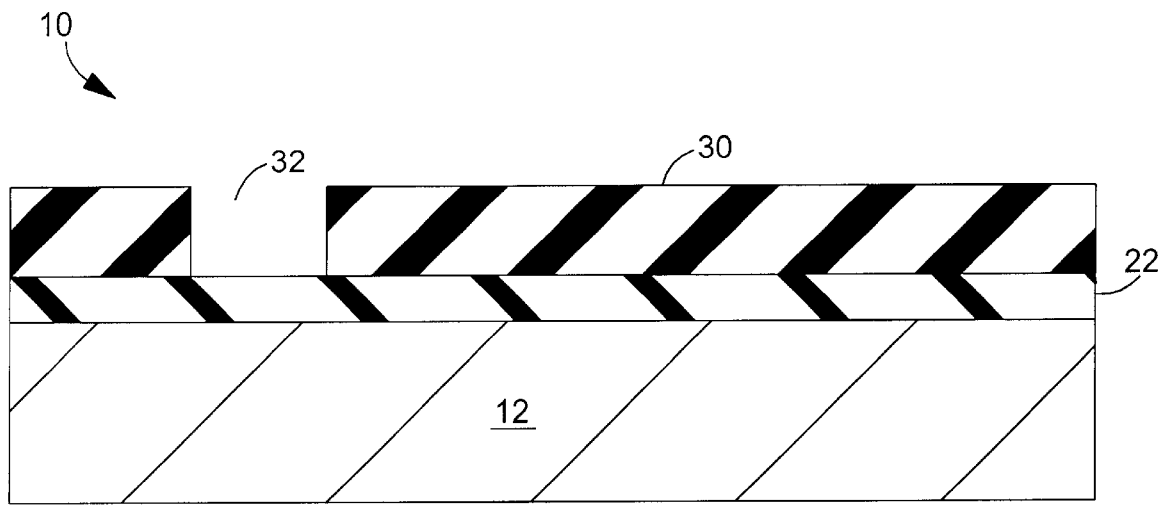
FIG. 3 is a cross-sectional view of the portion of the integrated circuit illustrated in FIG. 2, showing a photoresist-deposition and window-opening step.
Figure 4:
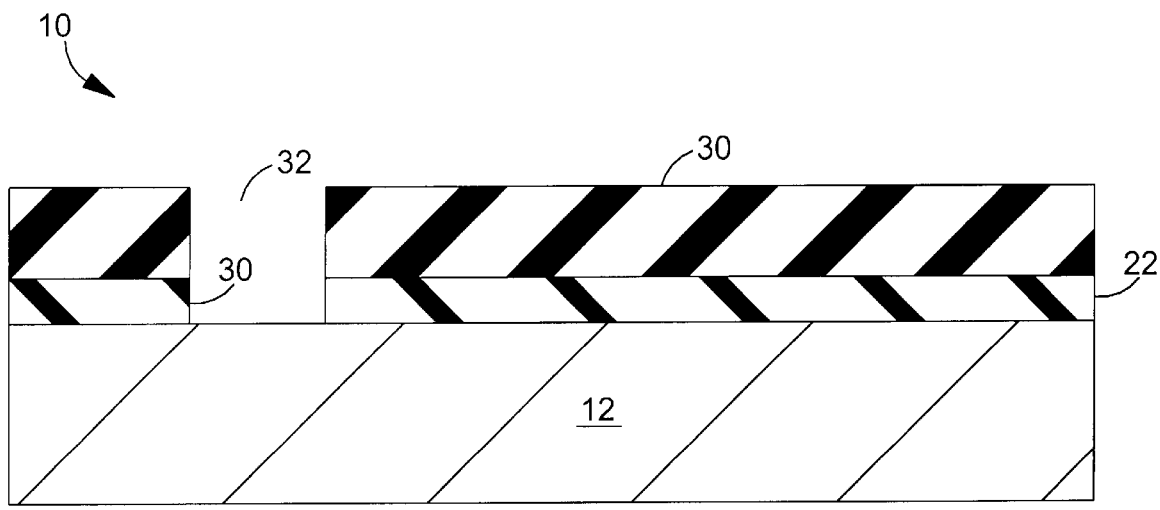
FIG. 4 is a cross-sectional view of the portion of the integrated circuit illustrated in FIG. 3, showing an etching step.

In FIG. 3, a cross-sectional view of portion 10 illustrates a step in which a photoresist layer 30 is disposed over oxide layer 22 and lithography is performed to open a window 32. Window 32 is a section in which photoresist layer 30 has been removed. In one embodiment, window 32 has a width of 500–2000 nm. In FIG. 4, a cross-sectional view of portion 10 illustrates a step in which an etching is performed at window 32 to remove a portion of oxide layer 22 exposed by window 32 to create a seeding window 33. Any type of patterning or lithography process can be utilized to create window 33. Preferably, a plasma etch or wet chemical etch selective to silicon dioxide is utilized.

Figure 5:
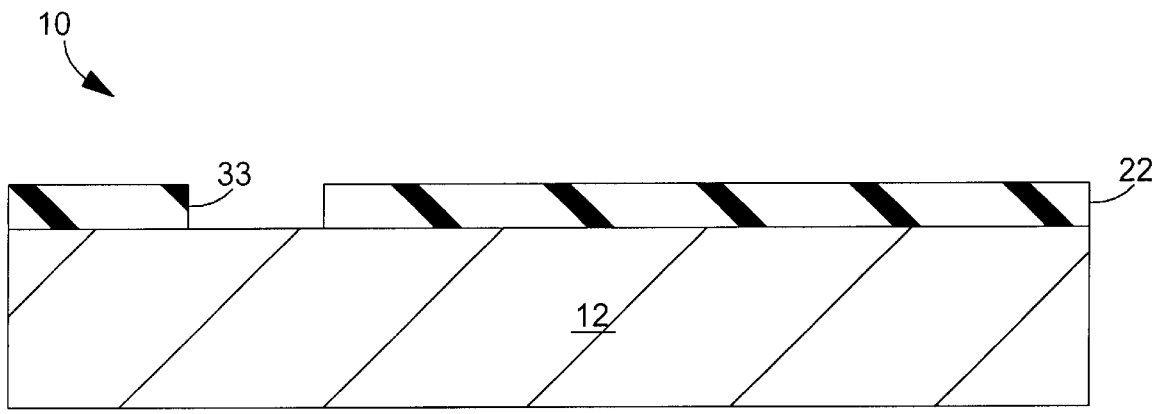
FIG. 5 is a cross-sectional view of the portion of the integrated circuit illustrated in FIG. 4, showing a photoresist removal step.

In FIG. 5, a cross-sectional view of portion 10 illustrates a step in which photoresist layer 30 is removed. Layer 30 can be removed in a conventional photoresist etch step.

Figure 6:
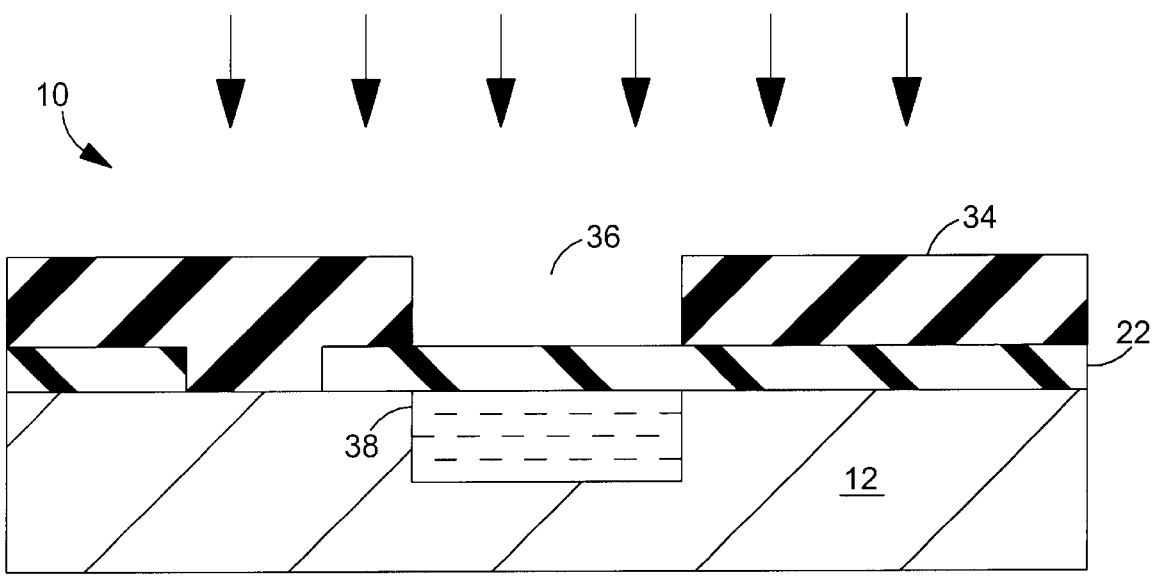
FIG. 6 is a cross-sectional view of the portion of the integrated circuit illustrated in FIG. 5, showing a photoresist-deposition, window-opening and implant step.

In FIG. 6, a cross-sectional view of portion 10 illustrates a step in which a photoresist layer 34 is deposited and a lithographic process is performed to open a window 36 in the area where gate structure 14 will later be formed. In an exemplary embodiment, germanium, silicon, xenon, or any amorphosizing species are implanted through window 36 and into substrate 12. This amorphization implant amorphizes back gate region 38. Preferably, germanium ions are provided at a very heavy dose (e.g., $5 \times 10^{14} - 5 \times 10^{15}$ $cm^{-2}$). After the amorphization implant, arsenic, phosphorous, or any such species of N-type dopant is implanted through the window 36 and into substrate 12. Alternatively, P-type dopant implants may be used. The dopant implant provides a doping of back gate region 38 in substrate 12. Region 38 can be a heavily doped P or N region (N+ or P+). Region 38 is 50–200 nm deep and 100–500 nm wide and designated by a dashed area in FIGS. 6–8.

Figure 7:
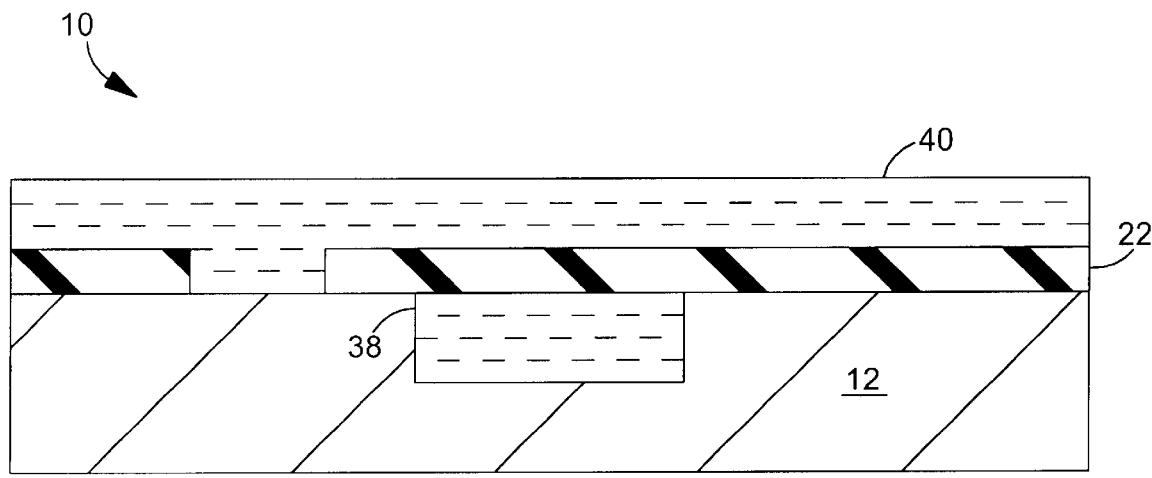
FIG. 7 is a cross-sectional view of the portion of the integrated circuit illustrated in FIG. 6, showing a photoresist removal and non-doped silicon layer deposition step.

IN FIG 7, a cross-sectional view of portion 10 illustrates a step in which photoresist layer 34 is removed and an amorphous silicon layer 40 is deposited over oxide layer 22 and substrate 12. In one embodiment, the amorphous silicon layer 40 has a thickness of 100–300 Å and is deposited at a temperature of 450–500C. The opening in oxide layer 22 provides a short contact between amorphous silicon layer 40 and substrate 12 which will be used as a seeding window during recrystallization. In an exemplary embodiment, the opening is 500–200 nm in width and layer 40 is deposited by LPCVD. Layer 40 is designated by a dashed area in FIGS. 7–8.

Figure 8:
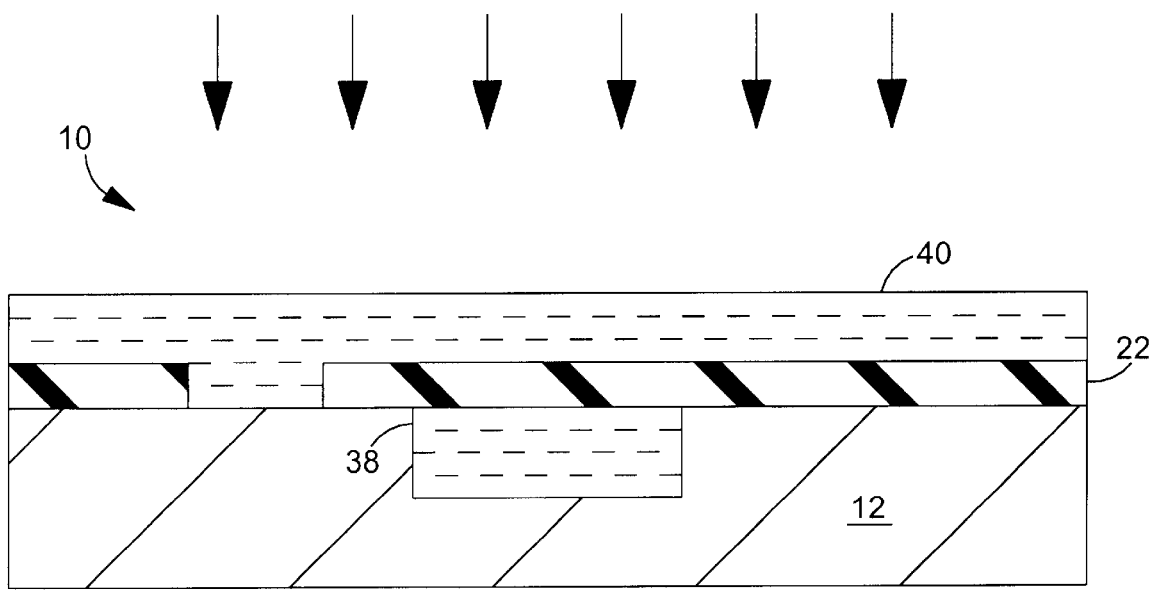
FIG. 8 is a cross-sectional view of the portion of the integrated circuit illustrated in FIG. 7, showing a laser-exposing step.

In FIG. 8, a cross-sectional view of portion 10 illustrates a step in which portion 10 is exposed to laser energy, such as an excimer laser beam having a 308 nm wavelength. The laser energy melts amorphous silicon layer 40 and amorphous silicon region 38 due to the low melting point of amorphous silicon as compared with adjacent crystalline silicon substrate 12. Alternatively, other annealing and rapid thermal annealing (RTA) processes can be utilized.

Figure 9:
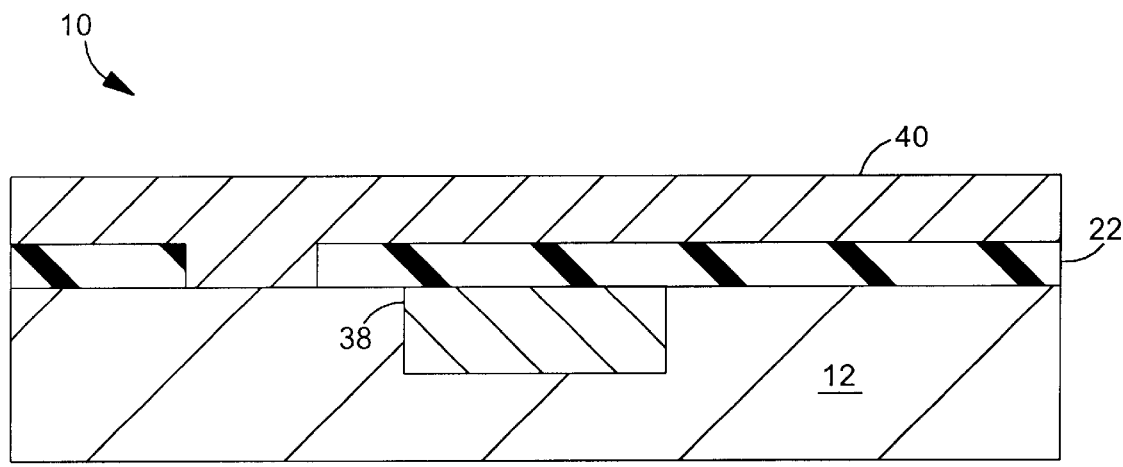
FIG. 9 is a cross-sectional view of the portion of the integrated circuit illustrated in FIG. 8, showing a recrystallizing step.

In FIG. 9, a cross-sectional view of portion 10 illustrates a step in which, after the laser energy is removed, amorphous silicon layer 40 and amorphous back gate region 38 become recrystallized. Recrystallization occurs when amorphous regions 38 and 40 are transformed into regions with a crystal structure matching that of adjacent crystalline substrate 12. The driving force for this recrystallization is the difference in internal energy between the melted amorphous regions 38 and 40 and adjacent crystalline substrate. Amorphous silicon layer 40 is separated from substrate 12 by oxide layer 22. The opening in oxide layer 22 operates as a seeding window which allows the amorphous silicon layer 40 to contact substrate 12, thereby providing the driving force in the form of differential internal energy for recrystallization of silicon layer 40.

The N+ dopant present in amorphous silicon region 38 becomes well activated due to the melting and recrystallization process. Subsequent to recrystallization, region 38 becomes back gate region 20.

Figure 10:
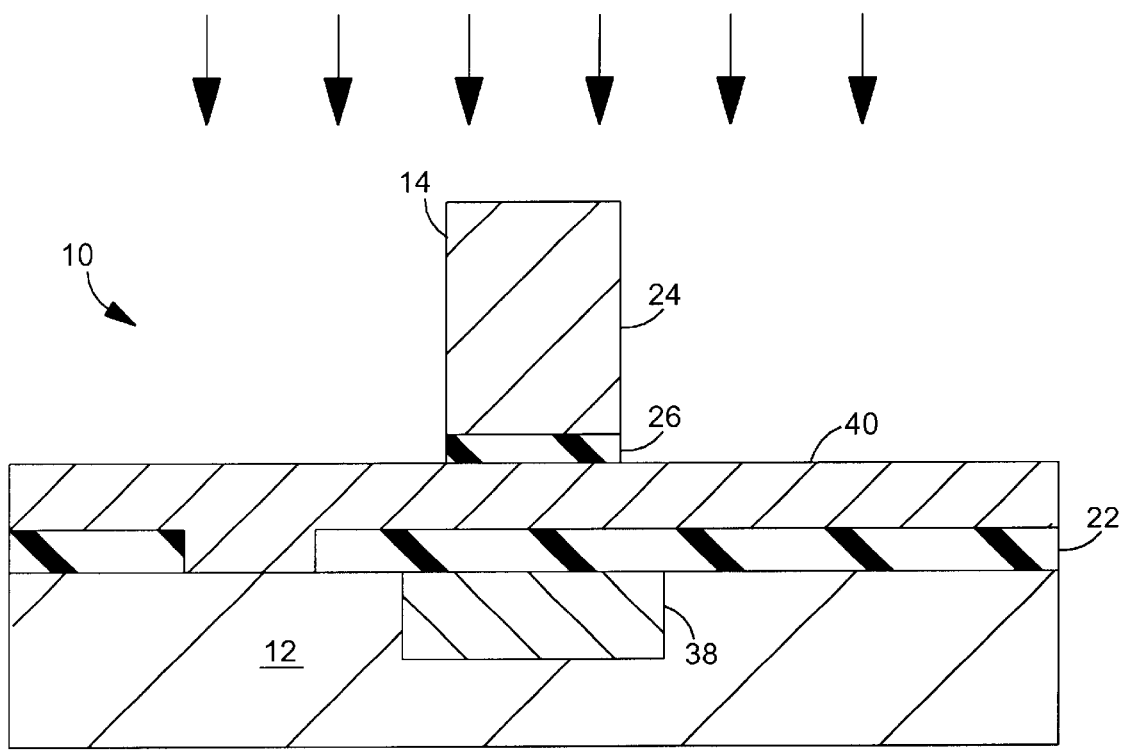
FIG. 10 is a cross-sectional view of the portion of the integrated circuit illustrated in FIG. 9, showing a gate structure formation step.

In FIG. 10, a cross-sectional view of portion 10 illustrates a step in which gate structure 14 (e.g., a front gate) is formed and an implant of N + dopant is provided for source region 16, drain region 18, and gate structure 14. The conventional CMOS processes can then be followed to complete the transistor fabrication. The seeding window or opening in oxide layer 22 can be covered by trench isolation or used as a contact for back gate region 20, depending on the layout design.

Principles, structures and examples discussed in the related patent application filed on an even date herewith by Yu entitled "Double Gate Transistor Having A Silicon/Germanium Channel Region" are incorporated herein by reference and can be utilized in the embodiments of the present application.

While the embodiments illustrated in the FIGURES and described above are presently preferred, it should be understood that these embodiments are offered by way of example only. Other embodiments may include, for example, different substrates, insulators, or materials. The invention is not limited to a particular embodiment, but extends to various modifications, combinations, and permutations that nevertheless fall within the scope and spirit of the appended claims.

What is claimed is:

1. A method of manufacturing a back gate for a semiconductor transistor, the method comprising:

providing an insulative layer above a substrate;

providing a seeding window in the insulative layer;

providing an amorphous semiconductor layer over the insulative layer;

providing an amorphization implant into the substrate to create an amorphous back gate region in the substrate;

melting the amorphous back gate region and the amorphous semiconductor layer; and recrystallizing the amorphous back gate region to form the back gate and crystallizing the amorphous semiconductor layer.

2. The method of claim 1, wherein the step of melting the amorphous back gate region comprises exposing the back gate region to laser energy.

3. The method of claim 2, wherein the laser energy is provided by an excimer laser.

4. The method of claim 1, further comprising implanting a dopant in at least one of the amorphous back gate region and the back gate.

5. The method of claim 4, wherein the dopant comprises at least one of arsenic and phosphorous.

6. The method of claim 1, wherein the amorphization implant comprises at least one of germanium, silicon, xenon and other materials which when implanted in a crystalline substrate amorphize the substrate.

7. The method of claim 1, wherein the semiconductor substrate comprises at least one of silicon, germanium, and gallium arsenide.

8. A method of manufacturing a semiconductor transistor structure, the method comprising:

(a) growing a thermal oxide layer on a semiconductor substrate;

(b) removing a portion of the thermal oxide layer to create a seeding window therein;

(c) implanting an amorphization implant into the substrate to create an amorphous back gate region in the substrate;

(d) implanting a dopant in the amorphous back gate region;

(e) depositing an amorphous silicon layer over the thermal oxide layer;

(j) melting the amorphous silicon layer and amorphous back gate region;

(k) crystallizing the melted amorphous silicon layer to form an active silicon layer; and (l) recrystallizing the amorphous back gate region to form an active back gate region.

9. The method of claim 8, wherein the melting amorphous silicon layer and amorphous back gate region step utilizes laser energy.

10. The method of claim 9, wherein the laser energy is provided by an excimer laser.

11. The method of claim 8, wherein the amorphization implant includes at least one of germanium, silicon, and xenon.

12. The method of claim 8, wherein the dopant includes at least one of arsenic and phosphorous.

13. The method of claim 8, wherein the amorphous silicon layer has thickness less than 300 angstroms.

14. The method of claim 8, further comprising doping the active silicon layer to create source and drain regions.

15. A method of manufacturing a back gate for a transistor, the transistor having a back gate region in a substrate and source and drain regions above the substrate, the method comprising:

providing a first layer above the substrate;

providing a seeding window in the first layer;

providing an implant into the substrate to create an amorphous region in the substrate;

providing an amorphous semiconductor layer above the first layer;

melting the amorphous region and the amorphous semiconductor layer; and converting the amorphous region and the amorphous semiconductor layer into active regions having a single crystal structure, the amorphous region being the back gate for the transistor.

16. The method of claim 15, wherein the step of melting the amorphous region comprises exposing the amorphous region to laser energy.

17. The method of claim 16, wherein the laser energy is provided by a laser emitting light with wavelength substantially equal to 308 nm.

18. The method of claim 15, further comprising implanting a dopant in at least one of the amorphous region and the amorphous semiconductor layer.

19. The method of claim 18, wherein the dopant comprises at least one of arsenic and phosphorous.

20. The method of claim 15, wherein the amorphization implant comprises at least one of germanium, silicon, xenon, and other materials which amorphize a substrate and lower the melting temperature of the substrate.

* * * * *